(12) United States Patent
Yin et al.

(10) Patent No.: US 11,735,554 B2
(45) Date of Patent: Aug. 22, 2023

(54) WAFER-LEVEL CHIP SCALE PACKAGING STRUCTURE HAVING A REWIRING LAYER AND METHOD FOR MANUFACTURING THE WAFER-LEVEL CHIP SCALE PACKAGING STRUCTURE

(71) Applicant: SJ SEMICONDUCTOR (JIANGYIN) CORPORATION, JiangYin (CN)

(72) Inventors: Chenguang Yin, JiangYin (CN); Yenheng Chen, JiangYin (CN)

(73) Assignee: SJ SEMICONDUCTOR (JIANGYIN) CORPORATION, Jiangyin (CN)

( * ) Notice: Subject to any disclaimer, the term of this patent is extended or adjusted under 35 U.S.C. 154(b) by 0 days.

(21) Appl. No.: 17/200,705

(22) Filed: Mar. 12, 2021

(65) Prior Publication Data
US 2022/0052011 A1    Feb. 17, 2022

(30) Foreign Application Priority Data

Aug. 14, 2020 (CN) .......................... 202010819073.9
Aug. 14, 2020 (CN) .......................... 202021696344.8

(51) Int. Cl.
*H01L 21/56* (2006.01)
*H01L 23/00* (2006.01)

(52) U.S. Cl.
CPC ............ *H01L 24/24* (2013.01); *H01L 21/568* (2013.01); *H01L 24/13* (2013.01); *H01L 24/19* (2013.01); *H01L 24/32* (2013.01); *H01L 24/82* (2013.01); *H01L 24/16* (2013.01); *H01L 24/73* (2013.01); *H01L 2224/02331* (2013.01);

(Continued)

(58) Field of Classification Search
CPC ....... H01L 21/568; H01L 24/13; H01L 24/16; H01L 24/19; H01L 24/20; H01L 24/24; H01L 24/32; H01L 24/73; H01L 24/82; H01L 2224/13024; H01L 23/3114; H01L 23/3135; H01L 2224/16145; H01L 2224/32145; H01L 2224/02331; H01L 2224/24137; H01L 2224/24147;

(Continued)

(56) References Cited

U.S. PATENT DOCUMENTS 5,635,671 A * 6/1997 Freyman ............. H01L 21/4864
                                                     257/E23.125
7,084,513 B2 * 8/2006 Matsuki .............. H01L 23/5389
                                                     257/E23.173

(Continued)

*Primary Examiner* — Khiem D Nguyen
(74) *Attorney, Agent, or Firm* — Alston & Bird LLP

(57) ABSTRACT

The present disclosure provides a wafer-level chip scale packaging structure and a method for manufacturing the same. The method includes the following steps: 1) providing a first supporting substrate; 2) placing a first chip on the first supporting substrate, and forming a first packaging layer on the first chip; 3) separating the first chip and the surface of the first packaging layer in contact with the first chip from the first supporting substrate, and attaching the other surface of the first packaging layer to a second supporting substrate; 4) disposing a second packaging layer on the surface of the first packaging layer which is in contact with the first chip; 5) forming a rewiring layer on the second packing layer, the rewiring layer is electrically connected to the first chip; and 6) electrically connecting a second chip to the rewiring layer.

8 Claims, 4 Drawing Sheets

(52) U.S. Cl.
CPC ............... *H01L 2224/13024* (2013.01); *H01L 2224/16145* (2013.01); *H01L 2224/24137* (2013.01); *H01L 2224/24147* (2013.01); *H01L 2224/32145* (2013.01); *H01L 2224/73204* (2013.01); *H01L 2224/828* (2013.01)

(58) Field of Classification Search
CPC ..... H01L 2224/73204; H01L 2224/828; H01L 2224/04105; H01L 2224/12105
USPC .......................................................... 257/738
See application file for complete search history.

(56) References Cited

U.S. PATENT DOCUMENTS

| | | | | |
|---|---|---|---|---|
| 8,778,733 | B2 * | 7/2014 | Fuergut | H01L 24/20 |
| | | | | 438/107 |
| 9,330,994 | B2 * | 5/2016 | Camacho | H01L 24/11 |
| 9,564,413 | B2 * | 2/2017 | Han | H01L 31/0203 |
| 9,768,155 | B2 * | 9/2017 | Lin | H01L 25/105 |
| 10,510,735 | B2 * | 12/2019 | Yu | H01L 24/03 |
| 10,872,842 | B2 * | 12/2020 | Wan | H01L 23/36 |
| 11,088,100 | B2 * | 8/2021 | Hsu | H01L 24/09 |
| 2005/0098891 | A1 * | 5/2005 | Wakabayashi | H01L 24/83 |
| | | | | 257/E25.023 |
| 2012/0231582 | A1 * | 9/2012 | Meyer-Berg | H01L 24/96 |
| | | | | 438/107 |
| 2014/0015131 | A1 * | 1/2014 | Meyer | H01L 24/73 |
| | | | | 257/738 |
| 2015/0108667 | A1 * | 4/2015 | Lai | B29C 39/26 |
| | | | | 438/107 |
| 2016/0099207 | A1 * | 4/2016 | Fuergut | H01L 23/49827 |
| | | | | 438/126 |
| 2016/0276238 | A1 * | 9/2016 | Lin | H01L 21/56 |
| 2017/0062390 | A1 * | 3/2017 | Chua | H01L 23/13 |
| 2018/0061767 | A1 * | 3/2018 | Chiang | H01L 25/50 |
| 2018/0068978 | A1 * | 3/2018 | Jeng | H01L 25/0652 |
| 2019/0131277 | A1 * | 5/2019 | Yang | H01L 24/05 |
| 2019/0206843 | A1 * | 7/2019 | Lyu | H01L 23/427 |
| 2020/0273803 | A1 * | 8/2020 | Hsu | H01L 23/5386 |

* cited by examiner ative chip packaging process where chips are obtained from cutting a wafer and then packaged and tested individually. Instead, in WLCSP, the chip packaging and testing are conducted on the wafer first and then the wafer is cut into chips, which not only saves packaging and testing costs, but also reduces the size of the finished chips.

WAFER-LEVEL CHIP SCALE PACKAGING STRUCTURE HAVING A REWIRING LAYER AND METHOD FOR MANUFACTURING THE WAFER-LEVEL CHIP SCALE PACKAGING STRUCTURE

CROSS REFERENCE TO RELATED APPLICATION

The present application claims the benefit of priority to Chinese Patent Application No. CN 2020108190739, entitled "WAFER-LEVEL CHIP SCALE PACKAGING STRUCTURE AND METHOD FOR MANUFACTURING SAME", filed with CNIPA on Aug. 14, 2020, and Chinese Patent Application No. CN 2020216963448, entitled "WAFER-LEVEL CHIP SCALE PACKAGING STRUCTURE", filed with CNIPA on Aug. 14, 2020, the disclosure of both are incorporated herein by reference in its entirety.

FIELD OF TECHNOLOGY

The present disclosure generally relates to semiconductor packaging, in particular, to a wafer-level chip scale packaging structure and a method for manufacturing the same.

BACKGROUND

Wafer-level chip scale packaging (WLCSP) is a promising new chip packaging method. It is different from the traditional chip packaging process where chips are obtained from cutting a wafer and then packaged and tested individually. Instead, in WLCSP, the chip packaging and testing are conducted on the wafer first and then the wafer is cut into chips, which not only saves packaging and testing costs, but also reduces the size of the finished chips.

At present, there are situations where multiple chips need to be packaged in the same packaging structure when manufacturing WLCSP products. In addition, for WLCSP, wafers' in-plane warpage is an important factor in controlling production costs and yield. However, with the WLCSP technologies that are currently available, packaging multiple chips in the same packaging structure will not only lead to a significant increase in the area size of the packaging structure, but such a packaging process is also difficult to integrate into existing processes, which introduces instabilities, and even causes the chips' performance to deteriorate in the future; and if the in-plane warpage does not fall within a specified range, the products will deform under stress, which in turn negatively affects the product yield.

SUMMARY

The present disclosure provides a method for preparing a wafer-level chip scale packaging structure, which includes: 1) providing a first supporting substrate; 2) placing a first chip on the first supporting substrate, and forming a first packaging layer on the first chip; 3) separating the first chip and the surface of the first packaging layer in contact with the first chip from the first supporting substrate, and attaching the other surface of the first packaging layer to a second supporting substrate; 4) disposing a second packaging layer on the surface of the first packaging layer which is in contact with the first chip; 5) forming a rewiring layer on the second packing layer, the rewiring layer is electrically connected to the first chip; and 6) electrically connecting a second chip to the rewiring layer.

The present disclosure also provides a wafer-level chip scale packaging structure, which includes: a first packaging layer; one or more first chips attached to a surface of the first packaging layer; a second packaging layer disposed on the first chips and the first packaging layer; a rewiring layer formed above the second packaging layer, the rewiring layer electrically connected to the first chips; and one or more second chips placed above the rewiring layer, then the second chips are electrically connected to the rewiring layer.

DETAILED DESCRIPTION

Figure 1:
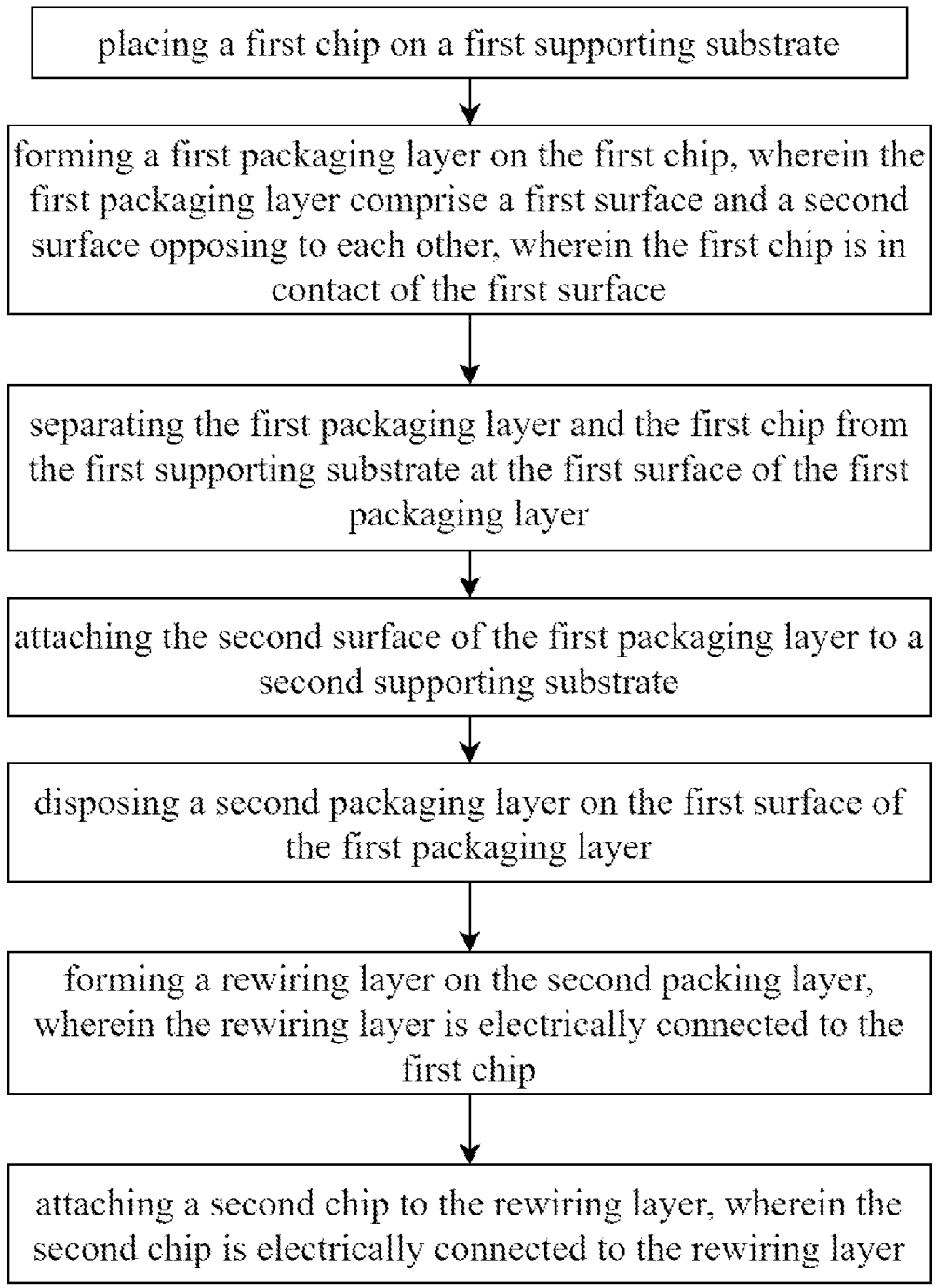
FIG. 1 is a flowchart illustrating a method for manufacturing a wafer-level chip scale packaging structure according to one embodiment of the present disclosure.

One or more specific embodiments of the present disclosure will be described below. These described embodiments are only examples of the presently disclosed techniques, and are not intended to limit aspects of the presently disclosed invention. Additionally, in an effort to provide a concise description of these embodiments, all features of an actual implementation may not be described in the specification. It should be appreciated that in the development of any such actual implementation, numerous implementation-specific decisions must be made to achieve the developers' specific goals, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Referring to FIG. 1 to FIG. 13, the present disclosure provides a method for preparing a wafer-level chip scale packaging structure, which includes the following steps:

1) providing a first supporting substrate 101;

2) placing one or more first chips 102 on the first supporting substrate 101 and forming a first packaging layer 103 covering the first chips 102;

3) peeling the first packaging layer 103 which contains the first chips 102 off from the first supporting substrate 101, and attaching the first packaging layer 103 to a second supporting substrate 104 at the side away from the first chips 102;

4) covering the side of the first packaging layer 103 containing the first chips 102 with a second packaging layer 105;

5) forming a rewiring layer 106 on the second packing layer 105, with the rewiring layer 106 electrically connected to the first chips 102; and 6) electrically connecting one or more second chips 107 to the rewiring layer 106.

Figure 2:
FIG. 2 shows a schematic cross-sectional view of a first supporting substrate according to an embodiment of the present disclosure.

At step 1), referring to FIG. 2 and S1 of FIG. 1, a first supporting substrate 101 is provided. In some embodiments, the first supporting substrate 101 includes a glass substrate. In some embodiments, as shown in FIG. 1, the first supporting substrate 101 is coated with a release layer 101a. The release layer 101a includes a light-to-heat conversion (LTHC) material layer, which can adhere to other parts and undergo denaturation and peeling after laser irradiation. The cost of a glass substrate is relatively low, the release layer 101a can be easily formed on the surface of the glass substrate, and the challenge of a subsequent separation process is reduced by adopting the glass substrate.

Figure 3:
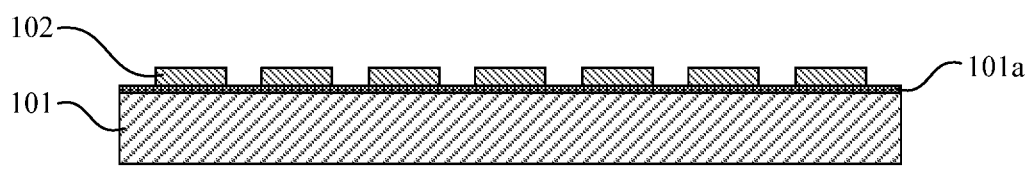
FIG. 3 shows a cross-sectional view of an intermediate structure where a first chip is provided according to one embodiment of the present disclosure.
Figure 4:
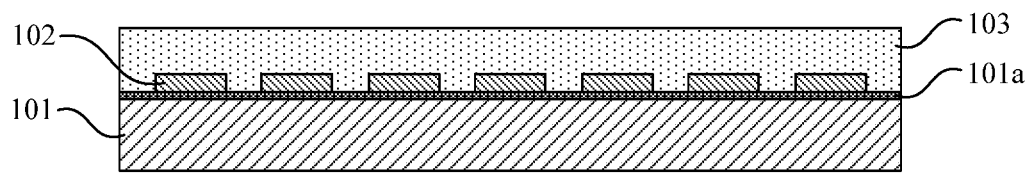
FIG. 4 shows a cross-sectional view of an intermediate structure where a first packaging layer is formed according to one embodiment of the present disclosure.

At step 2), referring to FIG. 3, FIG. 4, and S2 of FIG. 1, one or more first chips 102 are placed on the first supporting substrate 101, and a first packaging layer 103 is formed above the one or more first chips and the first supporting substrate 101.

In some embodiments, as shown in FIG. 3, the one or more first chips 102, through the release layer 101a, are attached to the first supporting substrate 101.

In some embodiments, as shown in FIG. 4, methods for forming the first packaging layer 103 include one of compression molding, transfer molding, liquid seal molding, vacuum lamination and spin coating; the first packaging layer 103 is made of materials including one of polyimide, silicone, and epoxy.

Figure 5:
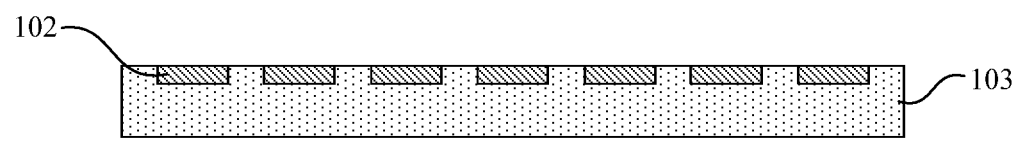
FIG. 5 shows a cross-sectional view of an intermediate structure where a first packaging layer is removed from a first supporting substrate according to one embodiment of the present disclosure.
Figure 6:
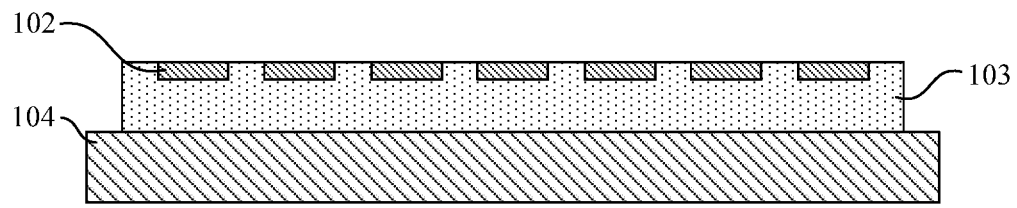
FIG. 6 shows a cross-sectional view of an intermediate structure where a first packaging layer is attached to a second supporting substrate according to one embodiment of the present disclosure.

At step 3), referring to FIG. 4, FIG. 5, FIG. 6, and S3 of FIG. 1, the first packaging layer 103 containing the first chips 102 is peeled off from the first supporting substrate 101, and the first packaging layer 103 containing the first chips 102 is attached to the second supporting substrate 104 at the side away from the first chips 102.

In some embodiments, as shown in FIG. 4 and FIG. 5, when peeling off the first packaging layer 103 containing the first chips 102 from the first supporting substrate 101, the first supporting substrate 101 and the first packaging layer 103 are separated by peeling off the release layer 101a. Specifically, when the release layer 101a includes an LTHC material layer, the release layer 101a is irradiated with a laser to make it lose its adhesion, and the first packaging layer 103 and the first supporting substrate 101 are then separated.

In some embodiments, as shown in FIG. 6, the first packaging layer is attached to the second support substrate 104 at the side away from the first chips 102; that is, the first 104 in FIG. 6 are placed upward. The second support substrate 104 can also be a glass substrate.

Figure 7:
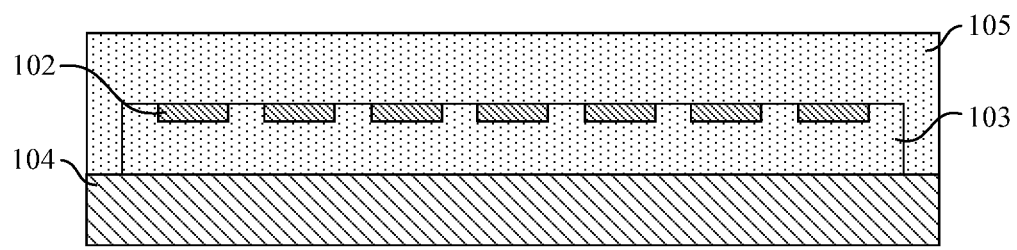
FIG. 7 shows a cross-sectional view of an intermediate structure where a second packaging layer is formed according to one embodiment of the present disclosure.

At step 4), referring to FIG. 7, and S4 of FIG. 1, the second packaging layer 105 is disposed on the side of the first packaging layer 103 containing the first chips 102. In some embodiments, as shown in FIG. 7, the material and forming method of the second packaging layer 105 are substantially the same as those of the first packaging layer 103. The second packaging layer 105 also wraps and covers the top surface and sidewalls of the first packaging layer 103. Since the packaging structure of 103 and 105 is supported by the supporting substrate 104 when the two packaging layers are formed, the wafer's warpage issue is mitigated.

At step 5), referring to FIG. 8, FIG. 9, FIG. 10, FIG. 11, and S5 of FIG. 1, a rewiring layer 106, electrically connected to the first chips 102, is formed on the second packaging layer 105.

Figure 8:
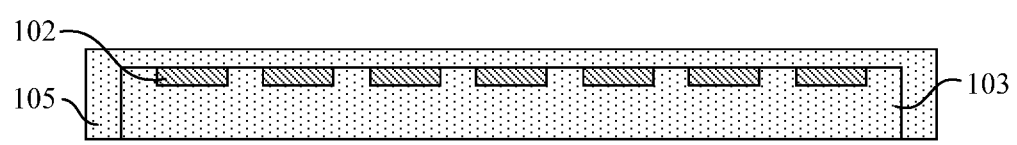
FIG. 8 shows a cross-sectional view of an intermediate structure where a second packaging layer is thinned according to one embodiment of the present disclosure.

In some embodiments, as shown in FIG. 8, before forming a rewiring layer 106, the first packaging layer 103 containing the first chips 102 and placed under the second packaging layer 105 is detached from the second supporting substrate 104.

Figure 9:
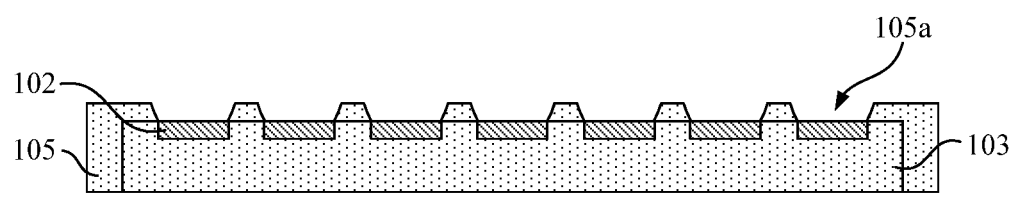
FIG. 9 shows a cross-sectional view of an intermediate structure where thorough holes are fabricated according to one embodiment of the present disclosure.

In some embodiments, as shown in FIG. 8, the second packaging layer 105 is thinned, to maintain a suitable thickness for the packaging structure. As shown in FIG. 9, the second packaging layer is patterned to form holes 105a which interconnect to the first chips 102. In some embodiments, the method for forming the through holes 105a includes a laser drilling process. The laser drilling process has good accuracy and high controllability, and can accurately form the through holes 105a without affecting other structures.

Figure 10:
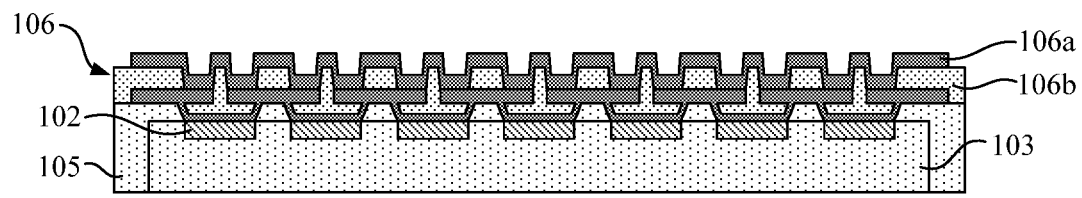
FIG. 10 shows a cross-sectional view of an intermediate structure where a rewiring layer is formed according to one embodiment of the present disclosure.

In some embodiments, as shown in FIG. 10, the rewiring layer 106 includes at least one metal wiring layer 106a, and a dielectric layer 106b that provides isolation for the metal wiring layer 106a. In some embodiments, as shown in FIG. 10, the wiring layer 106 includes two metal wiring layers 106a under and above the dielectric layer 106b.

Figure 11:
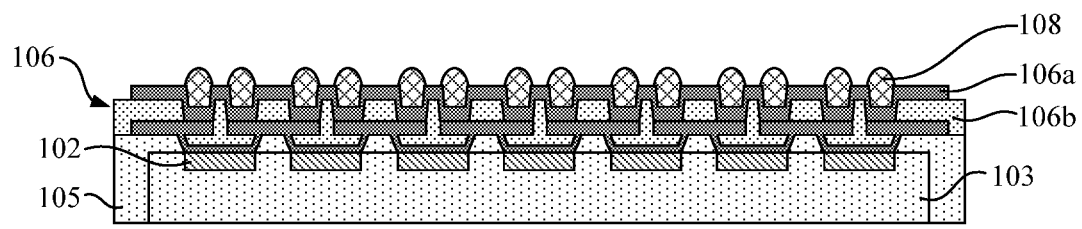
FIG. 11 shows a cross-sectional view of an intermediate structure where one or more solder balls are fabricated according to one embodiment of the present disclosure.

In some embodiments, as shown in FIG. 11, one or more solder balls 108 are also formed on the rewiring layer 106. Each of the solder balls 108 is made of one of the materials like tin solder, silver solder, and gold-tin alloy solder. In some other embodiments, the solder balls 108 can also be connected to the rewiring layer 106 through metal connection pillars.

Figure 12:
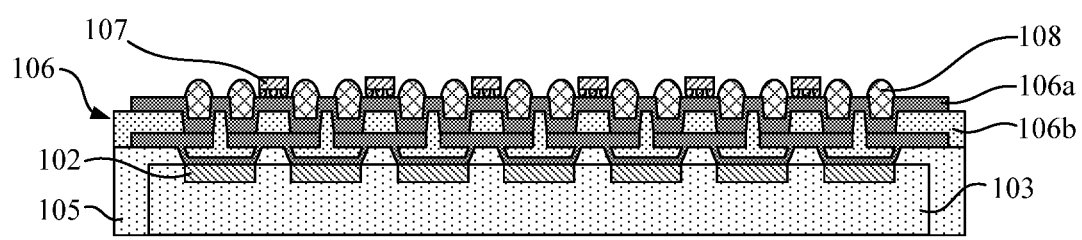
FIG. 12 shows a cross-sectional view of an intermediate structure where a rewiring layer is electrically connected to a one or more second chips according to one embodiment of the present disclosure.
Figure 13:
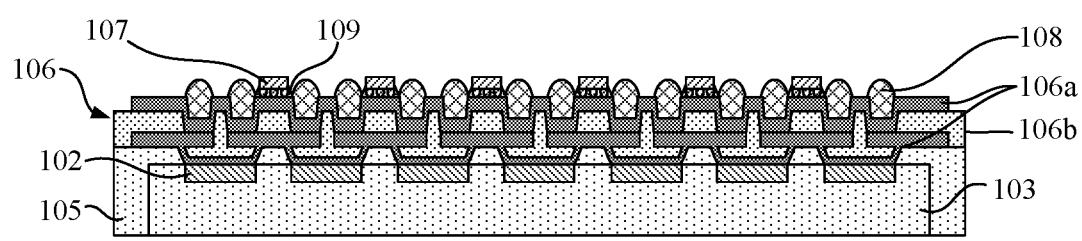
FIG. 13 shows a cross-sectional view of an intermediate structure where a filing layer is formed between a rewiring layer and a one or more second chips according to one embodiment of the present disclosure.

At step 6), referring to FIG. 12, FIG. 13, and S6 of FIG. 1, the rewiring layer 106 is electrically connected to the second chips 107. As shown in FIG. 12, each of the second chips 107 is placed between two solder balls 108, and is connected to the rewiring layer 106 by flip-chip welding. It can be seen from FIG. 12 that the first chips 102 and the second chips 107 are respectively formed on the lower and upper sides of the rewiring layer 106. This multi-layer composite structure reduces the footprint of the packaging structure, and is completed in a highly integrated packaging process.

In some embodiments, as shown in FIG. 13, a filling layer 109 is further formed between the rewiring layer 106 and the one or more second chips 107. In some embodiments, the material forming the filling layer 109 includes one or more of polyimide, silicone and epoxy. The filling layer 109 protects the electrical connection between the rewiring layer 106 and the second chips 107, and improves the stability of the interconnected structure.

As shown in FIG. 13, the present disclosure also provides a wafer-level chip scale packaging structure, which includes:

a first packaging layer 103;

first chips 102 attached to a surface of the first packaging layer 103;

a second packaging layer 105 disposed on the first chips 102 and the first packaging layer 103;

a rewiring layer 106 formed above the second packaging layer 105, the rewiring layer 106 electrically connected to the first chips 102; and one or more second chips 107 placed above and electrically connected to the rewiring layer 106.

The first packaging layer 103 and the second packaging layer 105 can be formed by a technique such as compression molding, transfer molding, liquid sealing, vacuum lamination or spin coating. The first packaging layer 103 and the second packaging layer 105 can be made of one of polyimide, silicone and epoxy.

In some embodiments, as shown in FIG. 7 and FIG. 13, through holes connecting the rewiring layer 106 and the first chips 102 are also formed in the second packaging layer 105. In some embodiments, the method of forming the through holes 105*a* includes a laser drilling process.

In some embodiments, as shown in FIG. 13, the rewiring layer 106 includes at least one metal wiring layer 106*a*, and a dielectric layer 106*b* that isolates the metal wiring layer 106*a*. In some embodiments, the rewiring layer 106 includes two metal wiring layers 106*a* separated by the dielectric layer 106*b*.

In some embodiments, one or more solder balls 108 are formed on the rewiring layer 106. The solder balls 108 include one of the materials such as tin solder, silver solder, and gold-tin alloy solder. In other embodiments, solder balls 108 are connected to the rewiring layer 106 through metal connecting pillars.

In some embodiments, a filling layer 109 is further formed between the rewiring layer 106 and the one or more second chips 107. In some embodiments, the filling layer 109 is made of one of polyimide, silicone and epoxy.

In summary, the present disclosure provides a wafer-level chip scale packaging structure and a method for manufacturing the same. The method includes the following steps: 1) providing a first supporting substrate; 2) placing one or more first chips on the first supporting substrate, and forming a first packaging layer on the first chip; 3) peeling off the first packaging layer which contains the first chips from the first supporting substrate, and attaching the second surface of the first packaging layer away from the first chips to a second supporting substrate; 4) disposing a second packaging layer on the side of the first packaging layer containing the first chips; 5) forming a rewiring layer on the second packing layer, the rewiring layer is electrically connected to the first chips; 6) electrically connecting one or more second chips to the rewiring layer. By introducing the first packaging layer and the second packaging layer into the manufacturing process, the process becomes more stable, thus the packaging structure's warpage defect is mitigated. The process is highly integrated. In addition, by disclosure this multilayer structure, the footprint of the packaging structure is also reduced.

While particular elements, embodiments, and applications of the present invention have been shown and described, it is understood that the invention is not limited thereto because modifications may be made by those skilled in the art, particularly in light of the foregoing teaching. It is therefore contemplated by the appended claims to cover such modifications and incorporate those features which come within the spirit and scope of the invention.

What is claimed is:

1. A method for preparing a wafer-level chip scale packaging structure, comprising:

placing a first chip on a first supporting substrate;

forming a first packaging layer on the first chip, wherein the first packaging layer comprises a first surface and a second surface opposing to each other, wherein the first chip is in contact of the first surface;

separating the first packaging layer and the first chip from the first supporting substrate at the first surface of the first packaging layer;

attaching the second surface of the first packaging layer to a second supporting substrate;

disposing a second packaging layer on the first surface of the first packaging layer;

forming a through hole in the second packaging layer over a surface of the first chip;

forming a rewiring layer on the second packaging layer, wherein the through-hole connects the first chip with the rewiring layer; and attaching a second chip on the rewiring layer, wherein the second chip is electrically connected to the first chip through the rewiring layer and the through hole in the second packaging layer.

2. The method for preparing a wafer-level chip scale packaging structure according to claim 1, further comprising:

before placing the first chip on the first supporting substrate, coating a release layer on the first supporting substrate, wherein the first chip is attached to the first supporting substrate through the release layer; and when separating the first packaging layer and the first chip from the first supporting substrate, peeling off the release layer.

3. The method for preparing a wafer-level chip scale packaging structure according to claim 1, further comprising:

before forming the rewiring layer on the second packaging layer, separating the first chip, the first packaging layer, and the second packaging layer from the second supporting substrate.

4. The method for preparing a wafer-level chip scale packaging structure according to claim 1, further comprising:

before forming the rewiring layer on the second packaging layer, thinning the second packaging layer and forming the through hole which is connected to the first chip.

5. The method for preparing a wafer-level chip scale packaging structure according to claim 4, wherein the through hole is formed by one or more methods including a laser drilling process.

6. The method for preparing a wafer-level chip scale packaging structure according to claim 1, wherein the rewiring layer comprises two metal wiring layers and a dielectric layer between the two metal wiring layers.

7. The method for preparing a wafer-level chip scale packaging structure according to claim 1, wherein one or more solder balls are formed on the rewiring layer.

8. The method for preparing a wafer-level chip scale packaging structure according to claim 1, wherein a filling layer is formed between the rewiring layer and the second chip.

\* \* \* \* \*